(12) United States Patent
Watanabe

(10) Patent No.: US 8,797,759 B2
(45) Date of Patent: Aug. 5, 2014

(54) ELECTRONIC MODULE AND COMMUNICATION APPARATUS

(75) Inventor: Hiroki Watanabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 202 days.

(21) Appl. No.: 13/556,570

(22) Filed: Jul. 24, 2012

(65) Prior Publication Data

US 2012/0287589 A1 Nov. 15, 2012

Related U.S. Application Data

(63) Continuation of application No. PCT/JP2010/061978, filed on Jul. 15, 2010.

(30) Foreign Application Priority Data

Jan. 25, 2010 (JP) ................................. 2010-013203

(51) Int. Cl.
*H05K 7/00* (2006.01)

(52) U.S. Cl.
USPC .......................................... 361/777; 361/783

(58) Field of Classification Search
CPC ............... H01L 2924/00; H01L 2224/16225; H01L 2224/32225; H01L 2224/73204; H01L 2924/00014; H01L 2224/48091; H01L 2924/01079; H01L 2924/01078; H01L 2924/01033; H01L 2924/00013; H01L 2924/01029; H01L 2924/15311; H01L 2924/1517; H01L 23/49827; H01L 2224/24227; H01L 23/49816; H01L 2224/16; H01L 2224/97; H01L 23/5389; H01L 2924/01005; H01L 2924/01015; H01L 2924/01; H01L 2224/48227; H01L 2224/73265; H01L 2924/00012

USPC ........... 361/777, 783, 760, 748, 679.01, 600, 361/807, 720; 174/250, 255, 256

See application file for complete search history.

(56) References Cited

U.S. PATENT DOCUMENTS 6,826,053 B2 * 11/2004 Kato et al. ..................... 361/715
2009/0174060 A1 * 7/2009 Moriyama et al. ............ 257/698

FOREIGN PATENT DOCUMENTS

| JP | 4-121780 U | 10/1992 |
|----|------------|---------|
| JP | 11-145605 A | 5/1999 |
| JP | 2002-43368 A | 2/2002 |
| JP | 2003-87094 A | 3/2003 |
| JP | 2003-249747 A | 9/2003 |
| JP | 2006-211620 A | 8/2006 |
| JP | 2007-59533 A | 3/2007 |

OTHER PUBLICATIONS

Official Communication issued in International Patent Application No. PCT/JP2010/061978, mailed on Oct. 12, 2010.

* cited by examiner

*Primary Examiner* — Jenny L Wagner
*Assistant Examiner* — Ahmad D Barnes
(74) *Attorney, Agent, or Firm* — Keating & Bennett, LLP

(57) ABSTRACT

An electronic module with excellent electrical characteristics includes an electronic component, a mount board, signal electrodes, a ground electrode, and an insulating layer. The electronic component is mounted on a first main surface of the mount board. The signal electrodes and the ground electrode are located on a second main surface of the mount board. The insulating layer is arranged so as to cover a portion of the second main surface of the mount board. The insulating layer is arranged so as not to cover end portions of the signal electrodes that face the ground electrode.

9 Claims, 7 Drawing Sheets

ELECTRONIC MODULE AND COMMUNICATION APPARATUS

BACKGROUND OF THE INVENTION

1. Field of the Invention

The present invention relates to an electronic module and a communication apparatus including the electronic module. In particular, the present invention relates to an electronic module including a mount board including one main surface on which an electronic component is mounted and another main surface including a portion which is covered with an insulating layer, and to a communication apparatus including the electronic module.

2. Description of the Related Art

For example, electronic modules in which an electronic component, such as a capacitor, an inductor, a high-frequency filter, or a semiconductor element, is mounted on a resin board or a ceramic board have been widely used. An example of such an electronic module is described, for example, in Japanese Unexamined Patent Application Publication No. 2002-43368.

FIG. 12 is a schematic sectional view of the electronic module described in Japanese Unexamined Patent Application Publication No. 2002-43368. As illustrated in FIG. 12, an electronic module 100 includes a semiconductor element 101, which is one type of electronic component, and a substrate 102 including one main surface 102a on which the semiconductor element 101 is mounted. On the other main surface 102b of the substrate 102, a plurality of electrodes 103 that are connected to the semiconductor element 101 are formed. The plurality of electrodes 103 include a ground electrode that is connected to the ground potential and a signal electrode that relates to input and output of signals. In the electronic module 100, a solder resist layer 104 is formed on the main surface 102b of the substrate 102. The solder resist layer 104 covers peripheral portions of all the electrodes 103. Accordingly, the plurality of electrodes 103 are not short-circuited. Soldering balls 105 are formed on the individual electrodes 103.

However, in the case of the electronic module 100, in which the peripheral portions of all the electrodes 103 are covered with the solder resist layer 104, there is a problem in which the electrical characteristics of the electronic module 100 degrade.

SUMMARY OF THE INVENTION

Accordingly, preferred embodiments of the present invention provide an electronic module with excellent electrical characteristics.

An electronic module according to a preferred embodiment of the present invention includes an electronic component, a mount board, a signal electrode, a ground electrode, and an insulating layer. The electronic component includes a signal terminal and a ground terminal. The mount board includes a first main surface and a second main surface. The electronic component is mounted on the first main surface of the mount board. The signal electrode is located on the second main surface of the mount board. The signal electrode is connected to the signal terminal. The ground electrode is located on the second main surface of the mount board. The ground electrode is connected to the ground terminal. The insulating layer is located so as to cover a portion of the second main surface of the mount board. The insulating layer is arranged so as not to cover an end portion of the signal electrode that faces the ground electrode.

In a specific aspect of the electronic module according to a preferred embodiment of the present invention, the insulating layer is arranged so as to be isolated from the end portion of the signal electrode that faces the ground electrode. With this configuration, the space between the signal electrode and the ground electrode can further be increased. Thus, the electrostatic capacitance generated between the signal electrode and the ground electrode can further be reduced. Therefore, transmission of a signal from the signal electrode to the ground electrode via the electrostatic capacitance generated between the signal electrode and the ground electrode can further efficiently be prevented. As a result, the electrical characteristics of the electronic module can further be improved.

In another specific aspect of the electronic module according to a preferred embodiment of the present invention, the ground electrode is arranged in such a manner that an end portion of the ground electrode that faces the signal electrode is covered with the insulating layer. With this configuration, the size of the ground electrode can be increased. Thus, the ground of the electronic module can be enhanced.

In another specific aspect of the electronic module according to a preferred embodiment of the present invention, the insulating layer is arranged so as to cover over at least a portion of an end portion of the signal electrode that does not face the ground electrode.

In still another specific aspect of the electronic module according to a preferred embodiment of the present invention, the insulating layer is arranged such that a plurality of portions of the ground electrode that are exposed from the insulating layer are provided. That is, in this configuration, a plurality of ground electrodes are arranged so as to be integrated with each other. Thus, the ground can further be enhanced. Furthermore, the parasitic impedance between the ground electrode and the ground potential can be reduced.

In still another specific aspect of the electronic module according to a preferred embodiment of the present invention, the mount board is preferably made of resin or ceramics, for example.

In still another specific aspect of the electronic module according to a preferred embodiment of the present invention, the insulating layer is preferably made of resin or ceramics, for example.

In still another specific aspect of the electronic module according to a preferred embodiment of the present invention, the electronic component is a filter that includes an input terminal and an output terminal as the signal terminal.

A communication apparatus according to a preferred embodiment of the present invention includes the electronic module according to other preferred embodiments of the present invention.

According to various preferred embodiments of the present invention, an insulating layer is arranged so as not to cover an end portion of a signal electrode that faces a ground electrode. Thus, there is no need to provide a large signal electrode while considering the formation accuracy of the insulating layer. Therefore, the space between the signal electrode and the ground electrode can be increased. Consequently, the electrostatic capacitance generated between the signal electrode and the ground electrode can be reduced. Accordingly, transmission of a signal from the signal electrode to the ground electrode via the electrostatic capacitance generated between the signal electrode and the ground electrode can be suppressed and prevented. As a result, the electrical characteristics of the electronic module can be improved.

The above and other elements, features, steps, characteristics and advantages of the present invention will become more

DETAILED DESCRIPTION OF THE PREFERRED EMBODIMENTS

Hereinafter, a preferred embodiment of the present invention will be explained by way of example of a communication apparatus 1 illustrated in FIG. 1. However, the communication apparatus 1 is merely a non-limiting example of a preferred embodiment of the present invention. A communication apparatus according to the present invention is not limited to the communication apparatus 1. In addition, an electronic module according to the present invention is not limited to a duplexer module 2 mounted on the communication apparatus 1.

Figure 1:
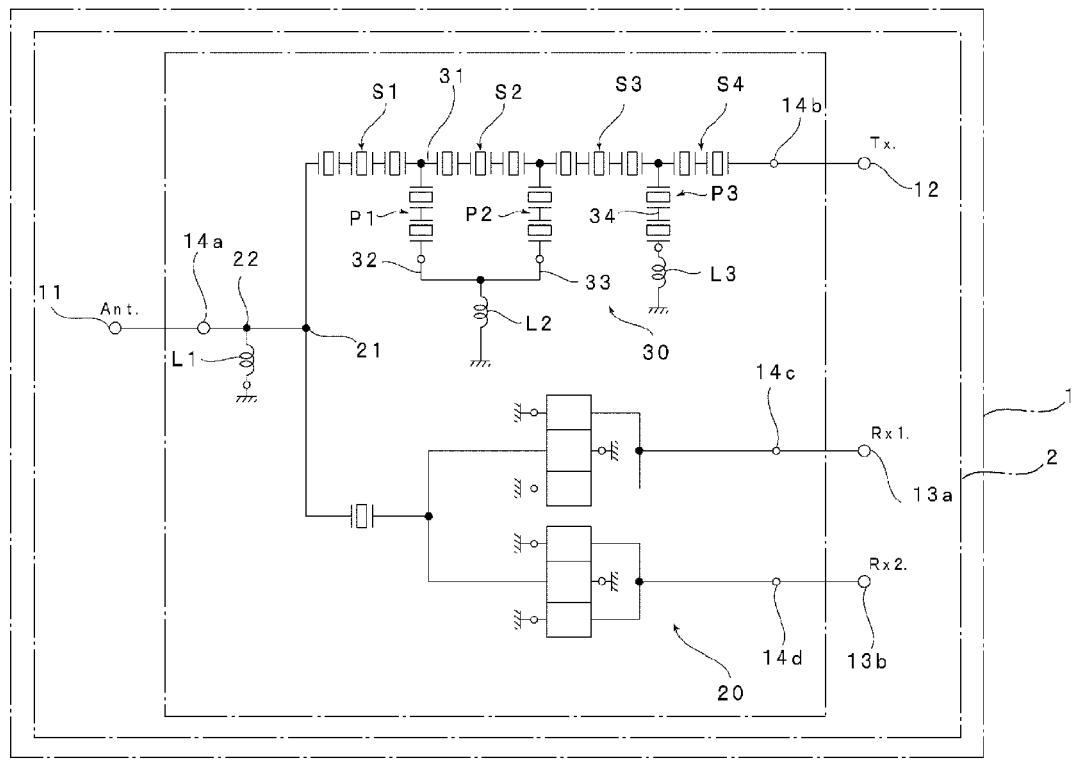
FIG. 1 is a schematic circuit diagram of a communication apparatus according to a preferred embodiment of the present invention.

FIG. 1 is a schematic circuit diagram of the communication apparatus 1 according to the present preferred embodiment. As illustrated in FIG. 1, the duplexer module 2 serving as an electronic module is mounted on the communication apparatus 1. More specifically, the communication apparatus 1 includes an RF (Radio Frequency) circuit. The duplexer module 2 is provided in the RF circuit.

In order to perform reception and transmission of signals at the same time in the communication apparatus 1, which is a cellular phone conforming to a CDMA (Code Division Multiple Access) method, such as UMTS (Universal Mobile Telecommunications System), for example, the duplexer module 2 is used for the RF circuit of the communication apparatus 1. More specifically, the duplexer module 2 is a duplexer module conforming to UMTS-BAND2. For UMTS-BAND2, the transmission frequency band (Tx band) ranges from 1850 MHz to 1910 MHz, and the reception frequency band (Rx band) ranges from 1930 MHz to 1990 MHz.

As illustrated in FIG. 1, the duplexer module 2 includes an antenna terminal 11, a transmission-side signal terminal 12, and first and second reception-side signal terminals 13a and 13b.

A reception-side filter unit 20 is connected between the antenna terminal 11 and the first and second reception-side signal terminals 13a and 13b. In this preferred embodiment, the reception-side filter unit 20 is a balanced-type filter unit having a balanced-unbalanced conversion function. The reception-side filter unit 20 includes a longitudinally coupled resonator-type acoustic wave filter unit.

A transmission-side filter unit 30 is connected between the antenna terminal 11 and the transmission-side signal terminal 12. In this preferred embodiment, the transmission-side filter unit 30 includes a ladder-type acoustic wave filter unit.

More specifically, the transmission-side filter unit 30 includes a plurality of series-arm resonators S1 to S4 that are connected in series between the antenna terminal 11 and the transmission-side signal terminal 12. The plurality of series-arm resonators S1 to S4 define a series arm 31. Parallel-arm resonators P1 to P3 are connected between the series arm 31 and the ground potential. The parallel-arm resonators P1 to P3 define parallel arms 32 to 34, respectively. A second inductor L2 is connected between the parallel-arm resonators P1 and P2 and the ground potential. In the parallel arm 34, a third inductor L3 is connected between the parallel-arm resonator P3 and the ground potential.

A connection point 21 is arranged between the transmission-side filter unit 30 and the reception-side filter unit 20, and a connection point 22 is arranged between the connection point 21 and the antenna terminal 11. A first inductor L1, which is for impedance matching, is connected between the connection point 22 and the ground potential.

Figure 2:
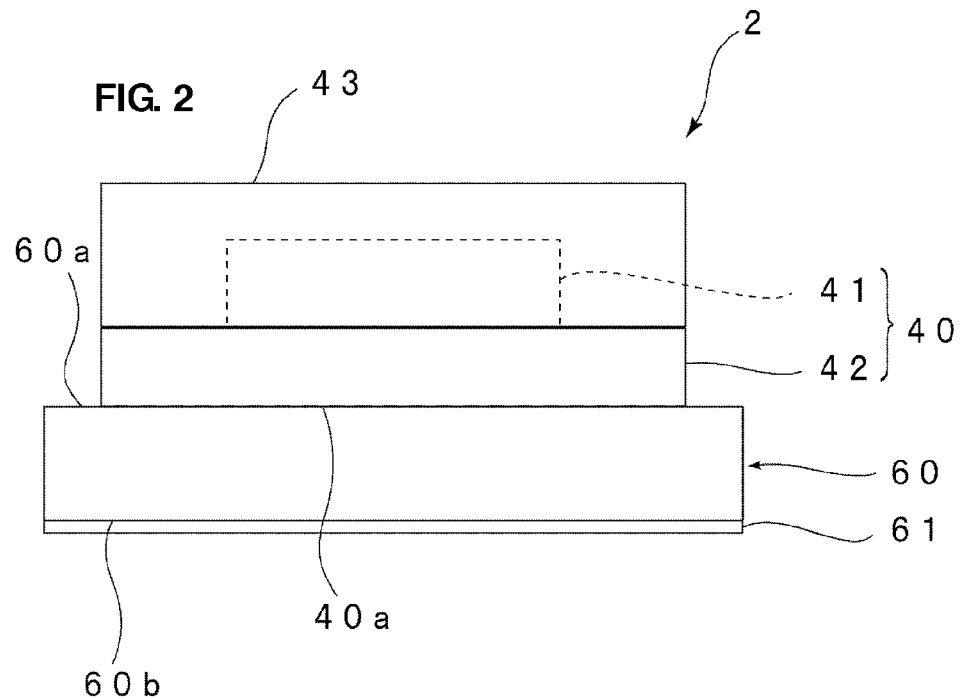
FIG. 2 is a schematic side view of a duplexer module according to a preferred embodiment of the present invention.

A specific apparatus configuration of the duplexer module 2 will now be explained with reference to FIG. 2 and so on. FIG. 2 is a schematic side view of the duplexer module 2 according to this preferred embodiment.

As illustrated in FIG. 2, the duplexer module 2 includes an electronic component 40 and a printed wiring board 60 that is made of resin and that serves as a mount board on which the electronic component 40 is mounted. In this preferred embodiment, an example in which the printed wiring board 60 is made of resin will be explained. However, the printed wiring board 60 may be made of ceramics or other suitable materials, for example.

The electronic component 40 includes a filter chip 41 and a ceramic board 42 on which the filter chip 41 is flip-chip mounted. The filter chip 41 is sealed with a sealing resin 43 provided on the ceramic board 42. The filter chip 41 may be a boundary acoustic wave filter chip using boundary acoustic waves, a surface acoustic wave filter chip using surface acoustic waves, or a bulk acoustic wave filter chip using bulk acoustic waves.

At least a portion of the transmission-side filter unit 30 and the reception-side filter unit 20 is provided in the electronic component 40. Signal terminals 14a to 14d, which are illustrated in FIG. 1, and a plurality of ground terminals to connect the transmission-side filter unit 30 and the reception-side filter unit 20 to the ground potential are located on a rear surface 40a of the electronic component 40. The signal terminal 14a serves as an output signal terminal of the transmission-side filter unit 30 and an input signal terminal of the reception-side filter unit 20. The signal terminal 14b serves as an input signal terminal of the transmission-side filter unit 30. The signal terminals 14c and 14d serve as first and second output balanced signal terminals of the reception-side filter unit 20.

Figure 3:
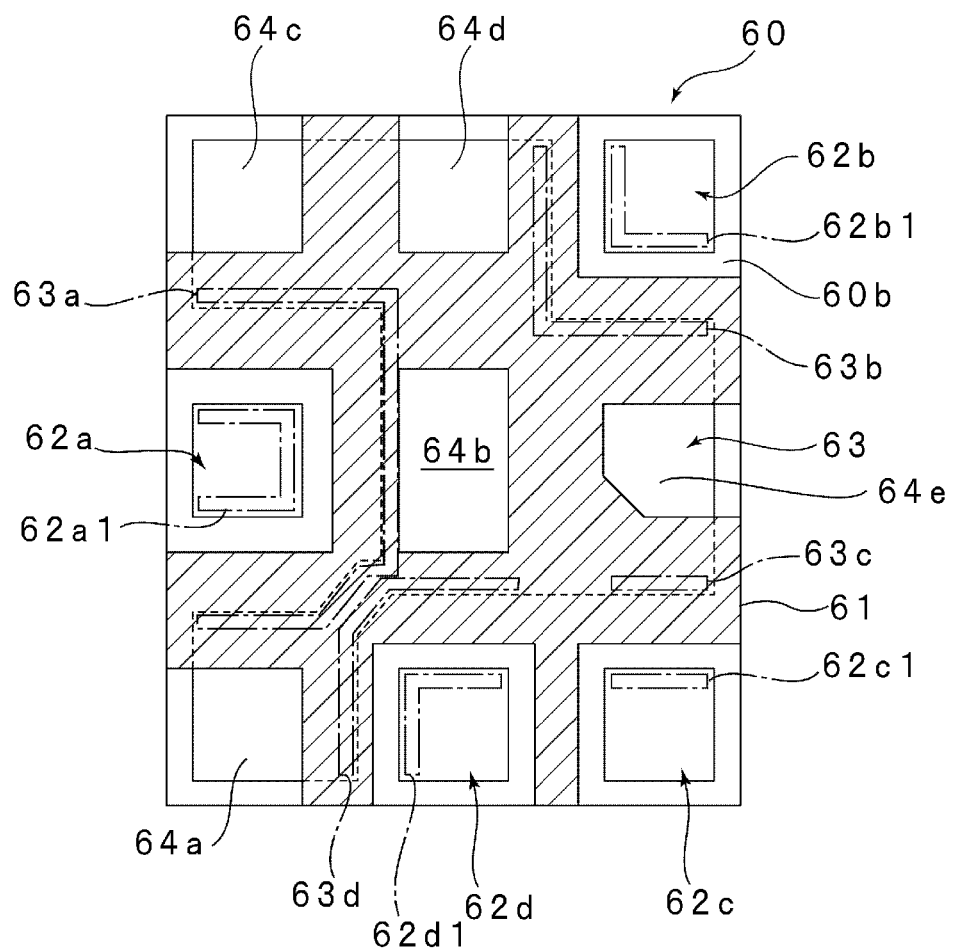
FIG. 3 is a schematic plan view of a second main surface of a printed wiring board in a duplexer module according to a preferred embodiment of the present invention.

FIG. 3 is a schematic plan view of a second main surface 60b of the printed wiring board 60. FIG. 3 is a diagram illustrating the state when viewed through from the upper surface of the duplexer module 2. As illustrated in FIG. 3, signal electrodes 62a to 62d that are connected to the signal terminals 14a to 14d are located on the second main surface 60b of the printed wiring board 60. More specifically, the signal electrode 62a is connected to the signal terminal 14a (see FIG. 1), which is an output signal terminal of the transmission-side filter unit 30 and an input signal terminal of the reception-side filter unit 20. The signal electrode 62b is connected to the signal terminal 14b (see FIG. 1), which is an input signal terminal of the transmission-side filter unit 30. The signal electrode 62c is connected to the signal terminal 14c (see FIG. 1), which is a first output balanced signal terminal of the reception-side filter unit 20. The signal electrode 62d is connected to the signal terminal 14d (see FIG. 1), which is a second output balanced signal terminal of the reception-side filter unit 20. That is, the signal electrode 62a serves as the antenna terminal 11. The signal electrode 62b serves as the transmission-side signal terminal 12. The signal electrode 62c serves as the first reception-side signal terminal 13a. The signal electrode 62d serves as the second reception-side signal terminal 13b.

A single ground electrode 63, which is connected to the plurality of ground terminals of the electronic component 40, is also located on the second main surface 60b of the printed wiring board 60.

As illustrated in FIGS. 2 and 3, the printed wiring board 60 serving as a mount board, includes a first main surface 60a and the second main surface 60b. The electronic component 40 is mounted on the first main surface 60a of the printed wiring board 60. An insulating layer 61 is arranged on the second main surface 60b of the printed wiring board 60 so as to cover a portion of the second main surface 60b. The insulating layer 61 is not particularly limited as long as it is a layer made of an insulating material. The insulating layer 61 may be made of resin or ceramics, for example. In this preferred embodiment, more specifically, the insulating layer 61 is preferably made of a resist resin, for example.

In FIG. 3, an oblique line portion represents a portion where the insulating layer 61 is located. As illustrated in FIG. 3, in this preferred embodiment, the insulating layer 61 is arranged so as not to cover end portions 62a1, 62b1, 62c1, and 62d1 of the signal electrodes 62a to 62d that face the ground electrode 63. More specifically, the insulating layer 61 is arranged so as to be isolated from the end portions 62a1, 62b1, 62c1, and 62d1 of the signal electrodes 62a to 62d that face the ground electrode 63. The insulating layer 61 is arranged so as to cover end portions 63a to 63d of the ground electrode 63 that face the signal electrodes 62a to 62d. In other words, the ground electrode 63 is arranged such that the end portions 63a to 63d of the ground electrode 63 that face the signal electrodes 62a to 62d are covered with the insulating layer 61. Furthermore, the insulating layer 61 is arranged such that a plurality of ground terminal portions, which are portions of the ground electrode 63 that are exposed from the insulating layer 61, are provided. More specifically, in this preferred embodiment, ground terminal portions 64a to 64e are provided. That is, in this preferred embodiment, the plurality of ground terminal portions 64a to 64e are defined by the single ground electrode 63. Accordingly, the ground of the duplexer module 2 can be enhanced. Furthermore, the parasitic impedance between the ground terminal portions 64a to 64e and the ground potential can be reduced.

Figure 4:
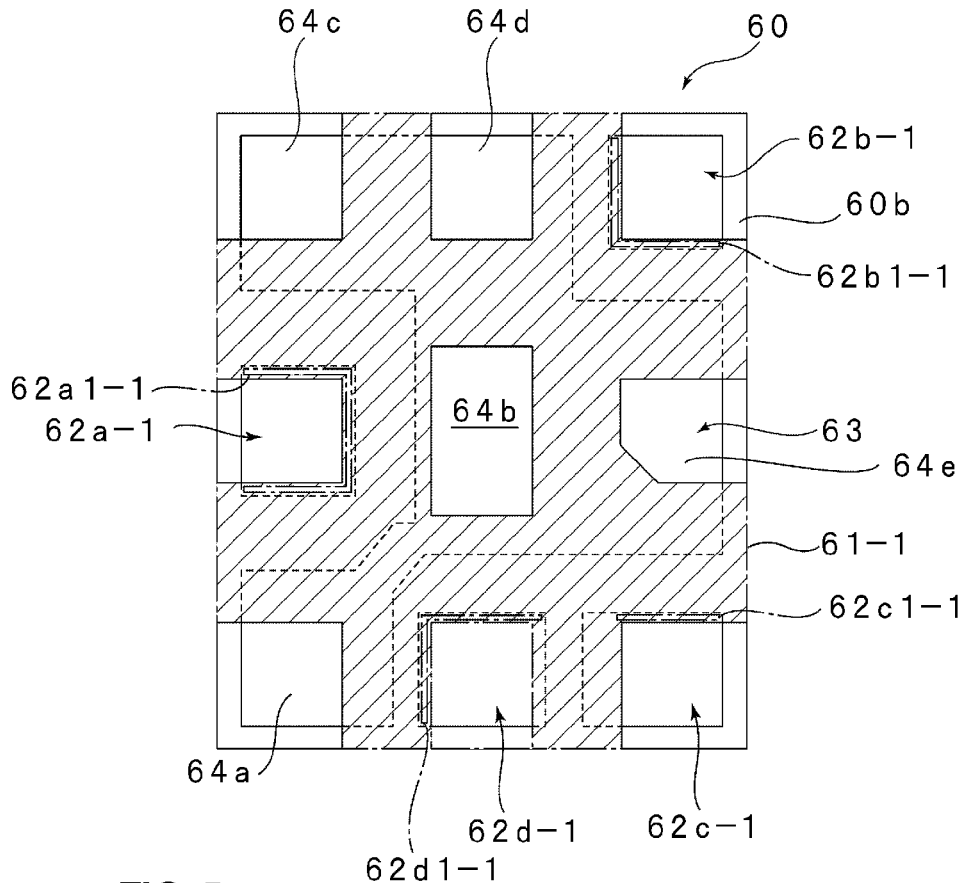
FIG. 4 is a schematic plan view of a second main surface of a printed wiring board in a duplexer module according to a comparative example.

As a comparative example of the duplexer module 2 according to this preferred embodiment, a duplexer module having a configuration similar to that of the duplexer module 2 according to this preferred embodiment with the exception of the configuration of signal electrodes and an insulating layer was prepared. FIG. 4 is a schematic plan view of a second main surface of a printed wiring board in a duplexer module according to a comparative example. FIG. 4 is a diagram illustrating the state when viewed through from the upper surface of the duplexer module according to the comparative example. For the convenience of explanation, also in the comparative example, members having functions substantially similar to those in this preferred embodiment will be referred to with common signs.

As illustrated in FIG. 4, the comparative example differs from this preferred embodiment in that an insulating layer 61-1 is arranged so as to cover end portions 62a1-1, 62b1-1, 62c1-1, and 62d1-1 of signal electrodes 62a-1 to 62d-1 that face the ground electrode 63.

Figure 5:
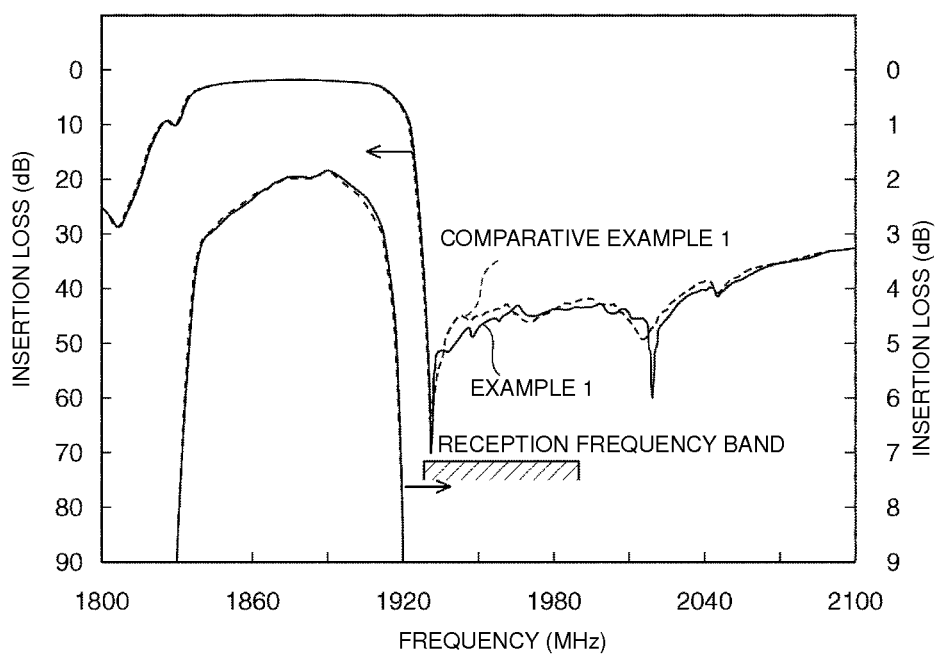
FIG. 5 is a graph illustrating the transmission characteristics of a transmission-side filter unit of the duplexer module according to a preferred embodiment of the present invention and the transmission characteristics of a transmission-side filter unit of the duplexer module according to the comparative example.

FIG. 5 illustrates the transmission characteristics of the transmission-side filter unit 30 of the duplexer module 2 according to this preferred embodiment and the transmission characteristics of a transmission-side filter unit of the duplexer module according to the comparative example. As is clear from the results illustrated in FIG. 5, in a reception frequency band (1930 MHz to 1990 MHz) that is higher than a transmission frequency band (1850 MHz to 1910 MHz), which is a pass-band of the transmission-side filter unit, the duplexer module 2 according to this preferred embodiment exhibits an attenuation greater than that of the duplexer module according to the comparative example. More specifically, in the reception frequency band (1930 MHz to 1990 MHz), the smallest attenuation exhibited by the duplexer module 2 according to this preferred embodiment is 43.0 dB, whereas the smallest attenuation exhibited by the duplexer module according to the comparative example is 41.7 dB. Thus, in the reception frequency band (1930 MHz to 1990 MHz), the smallest attenuation in this preferred embodiment is greater than the smallest attenuation in the comparative example by 1.3 dB.

Figure 6:
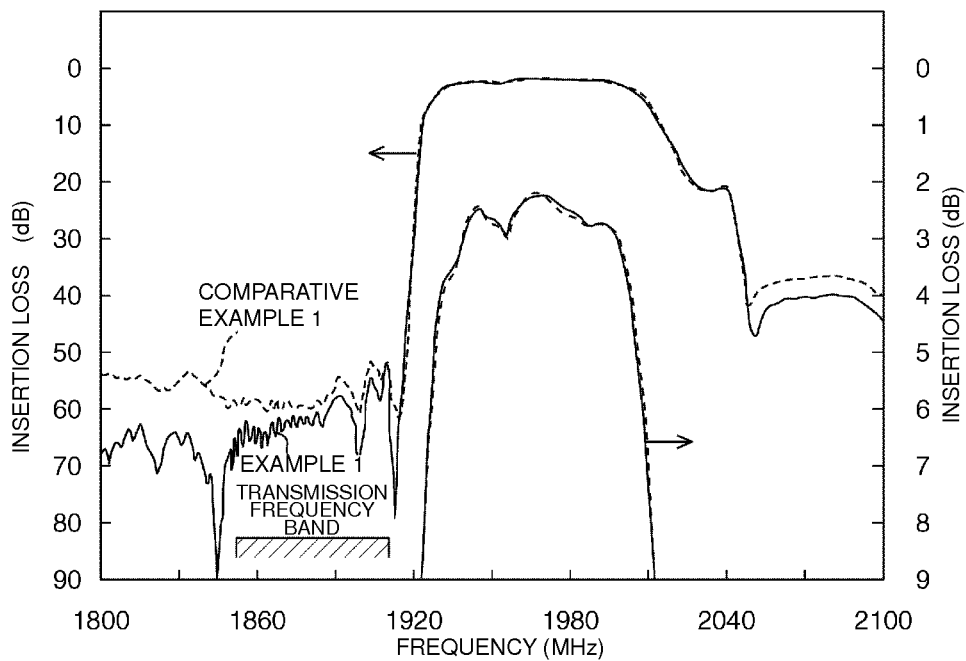
FIG. 6 is a graph illustrating the transmission characteristics of a reception-side filter unit of the duplexer module according to a preferred embodiment of the present invention and the transmission characteristics of a reception-side filter unit of the duplexer module according to the comparative example.

FIG. 6 illustrates the transmission characteristics of the reception-side filter unit 20 in the duplexer module 2 according to this preferred embodiment and the transmission characteristics of a reception-side filter unit of the duplexer module according to the comparative example. As is clear from the results illustrated in FIG. 6, in the transmission frequency band (1850 MHz to 1910 MHz) that is lower than the reception frequency band (1930 MHz to 1990 MHz), which is the pass-band of the reception-side filter unit, the duplexer module 2 according to this preferred embodiment exhibits an attenuation greater than that of the duplexer module according to the comparative example. More specifically, in the transmission frequency band (1850 MHz to 1910 MHz), the smallest attenuation exhibited by the duplexer module 2 according to this preferred embodiment is 53.3 dB, whereas the smallest attenuation exhibited by the duplexer module according to the comparative example is 51.0 dB. Thus, in the transmission frequency band (1850 MHz to 1910 MHz), the smallest attenuation in this preferred embodiment is greater than the smallest attenuation in the comparative example by 2.3 dB.

Figure 7:
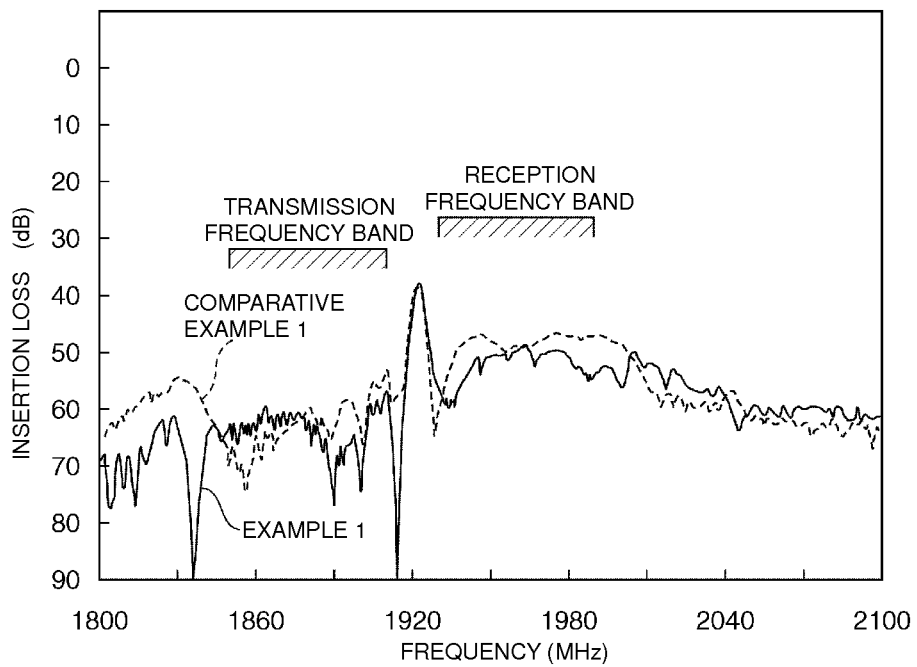
FIG. 7 is a graph illustrating the isolation characteristics of the duplexer module according to a preferred embodiment of the present invention and the isolation characteristics of the duplexer module according to the comparative example.

FIG. 7 illustrates the isolation characteristics of the duplexer module 2 according to this preferred embodiment and the isolation characteristics of the duplexer module according to the comparative example. Here, the isolation characteristics illustrated in FIG. 7 represent the characteristics of the isolation between the transmission-side signal terminal 12 and the first and second reception-side signal terminals 13a and 13b.

As is clear from the results illustrated in FIG. 7, in each of the reception frequency band (1930 MHz to 1990 MHz) and the transmission frequency band (1850 MHz to 1910 MHz), this preferred embodiment exhibits isolation characteristics superior to those of the comparative example. More specifically, in the transmission frequency band (1850 MHz to 1910 MHz), the smallest attenuation in this preferred embodiment is 56.5 dB, whereas the smallest attenuation in the comparative example is 52.5 dB. Thus, in the transmission frequency band, the smallest attenuation in this preferred embodiment is greater than the smallest attenuation in the comparative example by 4.0 dB. Furthermore, in the reception frequency band (1930 MHz to 1990 MHz), the smallest attenuation in this preferred embodiment is 48.9 dB, whereas the smallest attenuation in the comparative example is 46.6 dB. Thus, in the reception frequency band, the smallest attenuation in this preferred embodiment is greater than the smallest attenuation in the comparative example by 2.3 dB.

Figure 8:
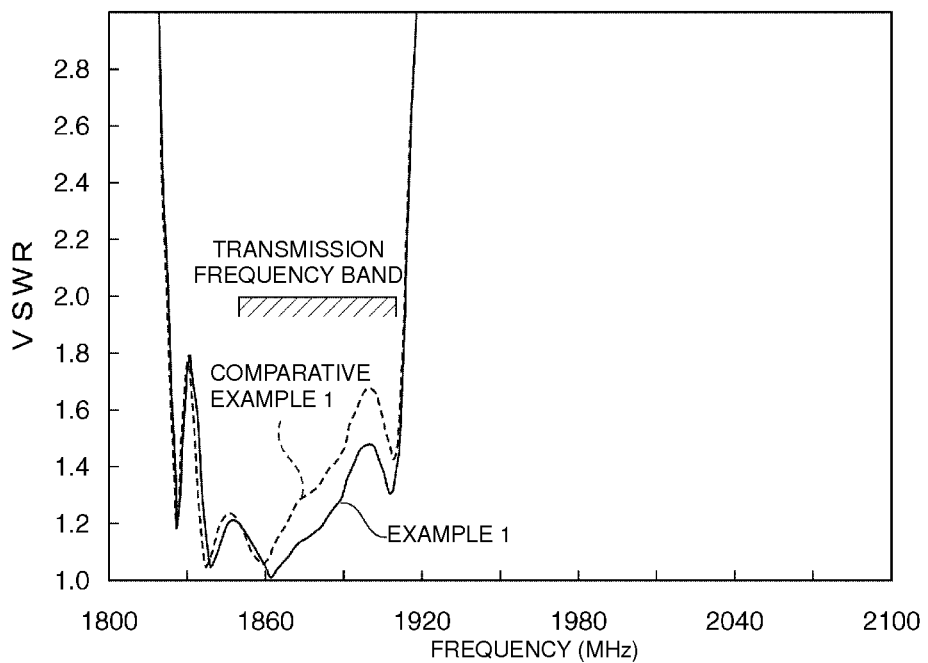
FIG. 8 is a graph illustrating the VSWR in a transmission-side signal terminal of the duplexer module according to a preferred embodiment of the present invention and the VSWR in a transmission-side signal terminal of the duplexer module according to the comparative example.
Figure 9:
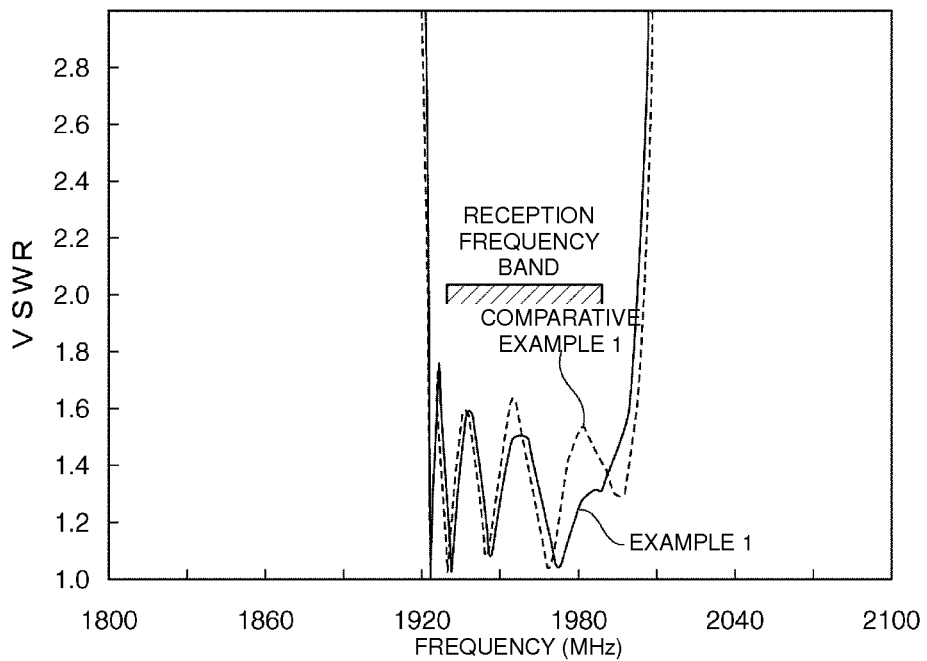
FIG. 9 is a graph illustrating the VSWR in first and second reception-side signal terminals of the duplexer module according to a preferred embodiment of the present invention and the VSWR in first and second reception-side signal terminals of the duplexer module according to the comparative example.
Figure 10:
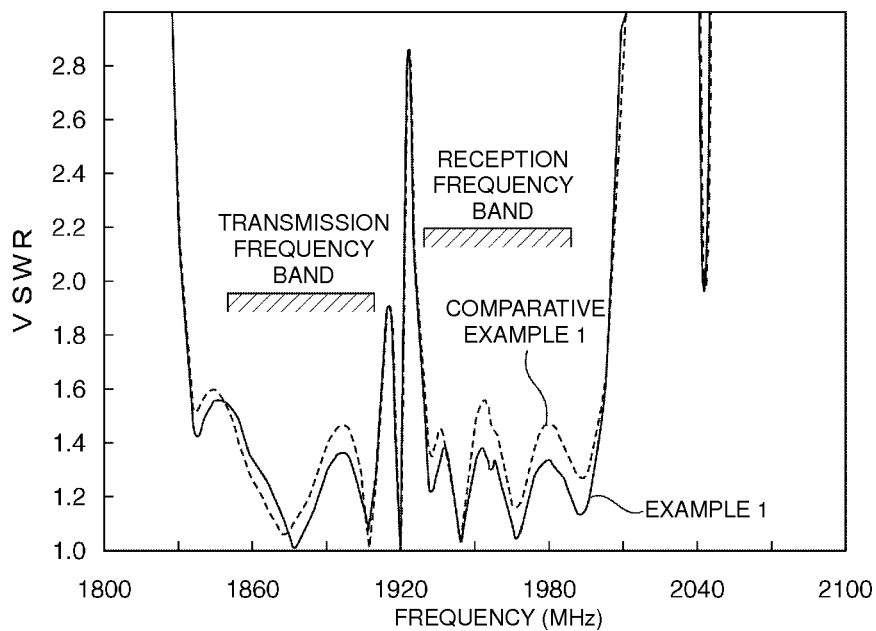
FIG. 10 is a graph illustrating the VSWR in an antenna terminal of the duplexer module according to a preferred embodiment of the present invention and the VSWR in an antenna terminal of the duplexer module according to the comparative example.

FIG. 8 illustrates the voltage standing wave ratio (VSWR) in the transmission-side signal terminal 12 of the duplexer module 2 according to this preferred embodiment and the VSWR in a transmission-side signal terminal of the duplexer module according to the comparative example. FIG. 9 illustrates the VSWR in the first and second reception-side signal terminals 13a and 13b of the duplexer module 2 according to this preferred embodiment and the VSWR in first and second reception-side signal terminals of the duplexer module according to the comparative example. FIG. 10 illustrates the VSWR in the antenna terminal 11 of the duplexer module 2 according to this preferred embodiment and the VSWR in an antenna terminal of the duplexer modulate according to the comparative example.

As illustrated in FIGS. 8 to 10, the VSWR in each of the transmission-side signal terminal 12, the first and second reception-side signal terminals 13a and 13b, and the antenna terminal 11 in this preferred embodiment is superior to that in the comparative example. More specifically, as illustrated in FIG. 8, in the case of the duplexer module 2 according to this preferred embodiment, in the transmission-side signal terminal 12, the maximum VSWR in the transmission frequency band (1850 MHz to 1910 MHz) is 1.49. In contrast, in the case of the duplexer module according to the comparative example, in the transmission-side signal terminal, the maximum VSWR in the transmission frequency band (1850 MHz to 1910 MHz) is 1.69. As illustrated in FIG. 9, in the case of the duplexer module 2 according to this preferred embodiment, in the first and second reception-side signal terminals 13a and 13b, the maximum VSWR in the reception frequency band (1930 MHz to 1990 MHz) is 1.38. In contrast, in the case of the duplexer module according to the comparative example, in the reception-side signal terminals, the maximum VSWR in the reception frequency band (1930 MHz to 1990 MHz) is 1.56. As illustrated in FIG. 10, in the case of the duplexer module 2 according to this preferred embodiment, in the antenna terminal 11, the maximum VSWR in the reception frequency band (1930 MHz to 1990 MHz) is 1.38. In contrast, in the case of the duplexer module according to the comparative example, in the antenna terminal, the maximum VSWR in the reception frequency band (1930 MHz to 1990 MHz) is 1.56.

As is clear from the results described above, by arranging the insulating layer 61 so as not to cover the end portions 62a1, 62b1, 62c1, and 62d1 of the signal electrodes 62a to 62d that face the ground electrode 63, excellent electrical characteristics can be realized. The reasons for this can be considered as described below.

The insulating layer 61 made of resin or ceramics preferably is generally formed by printing an insulating material and then curing the insulating material. Thus, for formation of the insulating layer 61, there is a need to consider a displacement of the position at which the insulating material is printed, shrinking of the insulating material at the time of curing, and the like. Therefore, as is clear from the comparison between FIGS. 3 and 4, in the case where the insulating layer 61-1 is formed such that the end portions 62a1-1 to 62d1-1 of the signal electrodes 62a-1 to 62d-1 are covered with the insulating layer 61-1 as in the comparative example, it is necessary to form the large signal electrodes 62a-1 to 62d-1 while considering the positional displacement and the shrinking described above. For example, in the comparative example illustrated in FIG. 4, the length of the individual sides of the signal electrodes 62a-1 to 62d-1 is greater than those of the signal electrodes 62a to 62d in this preferred embodiment illustrated in FIG. 3 by about 100 μm or more.

In the case where the large signal electrodes 62a-1 to 62d-1 are formed as in the comparative example, the distance between the signal electrodes 62a-1 to 62d-1 and the ground electrode 63 is reduced. Thus, in the comparative example, the electrostatic capacitance generated between the signal electrodes 62a-1 to 62d-1 and the ground electrode 63 is increased. Therefore, the amount of signal transmitted via the electrostatic capacitance increases. As a result, attenuation outside the pass-bands of the transmission-side filter unit and the reception-side filter unit reduces, and the isolation characteristics degrade.

In particular, the influence of the electrostatic capacitance increases as the frequency band to be used becomes higher. Thus, in particular, a great influence is exerted on a duplexer module conforming to UMTS-BAND2 or the like, thus degrading out-of-band attenuation and electrical characteristics such as isolation characteristics.

Furthermore, when the electrostatic capacitance generated between the signal electrodes 62a-1 to 62d-1 and the ground electrode 63 increases as in the comparative example, the impedance matching inside the pass-band degrades. As a result, in the comparative example, the VSWR degrades.

In contrast, in the case where the insulating layer 61 is formed so as not to cover the end portions 62a1, 62b1, 62c1, and 62d1 of the signal electrodes 62a to 62d that face the ground electrode 63 as in this preferred embodiment, there is no need to form the signal electrodes 62a to 62d to be large. Thus, the distance between the signal electrodes 62a to 62d and the ground electrode 63 can be set to be long. Therefore, the electrostatic capacitance generated between the signal electrodes 62a to 62d and the ground electrode 63 can be reduced. Consequently, attenuation outside the pass-bands of the transmission-side filter unit and the reception-side filter unit can be increased, and the isolation characteristics can be improved. Furthermore, excellent VSWR characteristics can be achieved. That is, excellent electrical characteristics can be realized.

In addition, the duplexer module 2 according to this preferred embodiment is superior to the duplexer module according to the comparative example in points different from the above-described points.

First, in the case where the printed wiring board 60 serving as a mount board is made of resin and the insulating layer 61 is made of a resist resin as in this preferred embodiment, the surface flatness of the signal electrodes 62a to 62d and the ground electrode 63 is high, thus increasing the stability of connection.

In the case where the insulating layer 61 made of a resist resin is formed, the resist resin is printed and then thermoset. In the processing for thermosetting the resist resin, due to shrinking of the resist resin, the printed wiring board 60, which is made of resin, is deformed, and the flatness of the printed wiring board 60 and the signal electrodes 62a to 62d and the ground electrode 63 that are formed on the second main surface 60b of the printed wiring board 60 degrades. The degree of deformation of the printed wiring board 60 caused by the shrinking of the resist resin decreases as the area of the insulating layer 61 decreases. In this preferred embodiment, since the insulating layer 61 is arranged so as not to cover the end portions 62a1, 62b1, 62c1, and 62d1 of the signal electrodes 62a to 62d that face the ground electrode 63 as described above, the area of the insulating layer 61 is small. Thus, the degree of deformation of the printed wiring board 60 caused by the shrinking of the resist resin in the processing for thermosetting the resist resin can be reduced. Consequently, a high flatness of the signal electrodes 62a to 62d and the ground electrode 63 can be maintained.

In addition, the duplexer module 2 according to this preferred embodiment is capable of measuring the electrical characteristics using a measuring device that includes anisotropic conductive rubber as a connection terminal with a high measuring stability compared to the duplexer module according to the comparative example. In characteristics screening processing for defective products in a process for manufacturing electronic modules including terminals of an LGA (Land Grid Array) type as in the duplexer module 2 according to this preferred embodiment, anisotropic conductive rubber may be used to measure the electrical characteristics, for example. For more detail, an electronic module and a measuring jig are electrically connected by arranging anisotropic conductive rubber, which is made of silicon rubber and a metal pin, and the electronic module on the measuring jig and applying pressure from the upper surface side of the electronic module. Pressure is applied via the electronic module to the silicon rubber forming the anisotropic conductive rubber, and the silicon rubber shrinks. Then, the measuring jig and a terminal of the electronic module are physically in contact via the metal pin embedded in the silicon rubber, and the electronic module and the measuring jib are thus electrically connected.

Here, in the case of the duplexer module according to the comparative example, peripheral portions of all the electrodes located on the second main surface of the printed wiring board are covered with the insulating layer. Thus, the surface of the electrodes is located in recessed portions of the insulating layer. Therefore, in order to achieve electrical conduction between the individual electrodes and the measuring jig, the silicon rubber needs to be greatly deformed by the amount corresponding to the thickness of the insulating layer.

In contrast, in the case of the duplexer module 2 according to this preferred embodiment, peripheral portions of the signal electrodes 62a to 62d located on the second main surface 60b of the printed wiring board 60 are not covered with the insulating layer 61. That is, the signal electrodes 62a to 62d are arranged so as to be isolated from the insulating layer 61. Thus, the degree of deformation of silicon rubber necessary to achieve electrical conduction between the signal electrodes 62a to 62d and the measuring jig can be smaller than that for the comparative example. Consequently, the measuring stability is improved.

Furthermore, in this preferred embodiment, the ground terminal portions 64a to 64e are preferably integrated with each other as the ground electrode 63. Thus, electrical conduction only between at least one of the ground terminal portions 64a to 64e, which are exposed portions of the ground electrode 63, and the measuring jig is required. Consequently, the measuring stability is improved.

Hereinafter, variations of the foregoing preferred embodiment will be explained. In the explanation given below, members having functions substantially common with those in the foregoing preferred embodiment will be referred to with common signs and the explanation for those members will be omitted.

Figure 11:
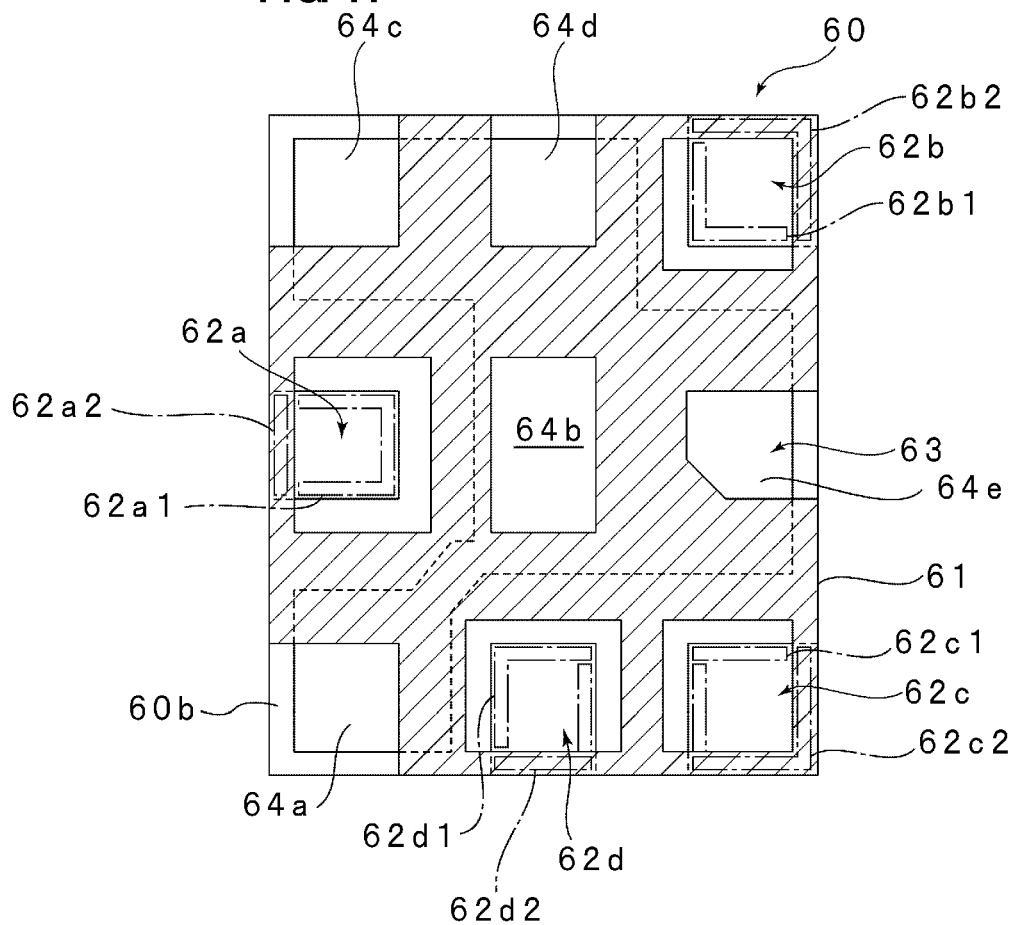
FIG. 11 is a schematic plan view of a second main surface of a printed wiring board of a duplexer module according to a first variation of a preferred embodiment of the present invention.
Figure 12:
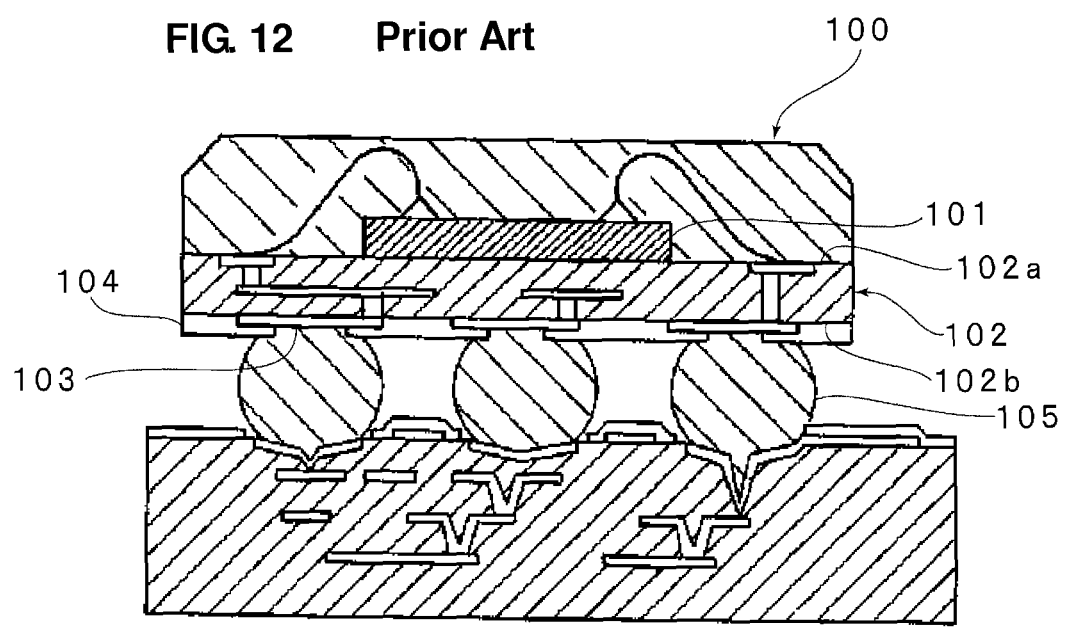
FIG. 12 is a schematic sectional view of an electronic module described in Japanese Unexamined Patent Application Publication No. 2002-43368.

FIG. 11 is a schematic plan view of the second main surface 60b of the printed wiring board 60 in a duplexer module according to a first variation of a preferred embodiment of the present invention. FIG. 11 is a diagram illustrating the state when viewed through from the upper surface of the duplexer module according to the first variation.

In the foregoing preferred embodiment, the example in which the individual signal electrodes 62a to 62d preferably are not entirely covered with the insulating layer 61 has been explained. However, the present invention is not limited to this configuration. For example, as illustrated in FIG. 11, the insulating layer 61 may be arranged so as to cover over at least a portion of end portions 62a2, 62b2, 62c2, and 62d2 of the signal electrodes 62a to 62d that do not face the ground electrode 63. That is, the insulating layer 61 is arranged so as to also cover over end portions of the signal electrodes 62a to 62d that do not face any other electrodes. In other words, the insulating layer 61 is arranged so as to cover over portions of the signal electrodes 62a to 62d that locate at peripheral portions of the printed wiring board 60. Accordingly, for mounting of the duplexer module 2 on the RF circuit of the communication apparatus 1, peeling of the signal electrodes 62a to 62d due to thermal stress can be effectively prevented.

Also in this variation, since the end portions 62a1 to 62d1 of the signal electrodes 62a to 62d are not covered with the insulating layer 61, advantages such as improvement in the electrical characteristics, improvement in the electrode flatness, and improvement in the measuring stability of electrical measurement, can be achieved, as in the foregoing preferred embodiment.

In the foregoing preferred embodiment, the case where a printed wiring board serving as a mount board preferably is made of resin has been explained. However, the mount board may be made of ceramics. Furthermore, the insulating layer may be made of ceramics.

In the foregoing preferred embodiment, the example in which the electronic component includes a single duplexer has been explained. However, in the present invention, the electronic component is not particularly limited to any type.

The electronic module may include a plurality of duplexers, may include a plurality of high-frequency filters, may include a triplexer or the like, may include a duplexer or a triplexer and a high-frequency filter, may include a duplexer or a triplexer and a power amplifier, or the like. Furthermore, the electronic component may be a capacitor, an inductor, a semiconductor element, or other suitable component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic module comprising:
   an electronic component that includes a signal terminal and a ground terminal;
   a mount board that includes a first main surface and a second main surface, the electronic component being mounted on the first main surface;
   a signal electrode that is located on the second main surface of the mount board and that is connected to the signal terminal;
   a ground electrode that is located on the second main surface of the mount board and that is connected to the ground terminal; and
   an insulating layer that is arranged so as to cover a portion of the second main surface of the mount board; wherein the insulating layer is arranged so as not to cover an end portion of the signal electrode that faces the ground electrode.

2. The electronic module according to claim 1, wherein the insulating layer is isolated from the end portion of the signal electrode that faces the ground electrode.

3. The electronic module according to claim 1, wherein the ground electrode is arranged such that an end portion of the ground electrode that faces the signal electrode is covered with the insulating layer.

4. The electronic module according to claim 1, wherein the insulating layer is arranged to cover over at least a portion of an end portion of the signal electrode that does not face the ground electrode.

5. The electronic module according to claim 1, wherein the insulating layer is arranged such that a plurality of portions of the ground electrode that are exposed from the insulating layer are provided.

6. The electronic module according to claim 1, wherein the mount board is made of resin or ceramics.

7. The electronic module according to claim 1, wherein the insulating layer is made of resin or ceramics.

8. The electronic module according to claim 1, wherein the electronic component is a filter that includes an input terminal and an output terminal as the signal terminal.

9. A communication apparatus comprising the electronic module according to claim 1.

* * * * *